United States Patent
Noh

(10) Patent No.: US 10,381,104 B2
(45) Date of Patent: Aug. 13, 2019

(54) SEMICONDUCTOR DEVICE

(71) Applicant: SK hynix Inc., Icheon-si, Gyeonggi-do (KR)

(72) Inventor: Young-Kyu Noh, Seongnam-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/945,951

(22) Filed: Apr. 5, 2018

(65) Prior Publication Data

US 2019/0051373 A1    Feb. 14, 2019

(30) Foreign Application Priority Data

Aug. 9, 2017    (KR) .................. 10-2017-0101159

(51) Int. Cl.
| | |
|---|---|
| G11C 17/00 | (2006.01) |
| G11C 29/00 | (2006.01) |
| G11C 17/18 | (2006.01) |
| H03K 5/135 | (2006.01) |
| G11C 17/16 | (2006.01) |
| G11C 29/12 | (2006.01) |
| G11C 7/10 | (2006.01) |
| G11C 7/22 | (2006.01) |
| G11C 8/18 | (2006.01) |
| G11C 29/04 | (2006.01) |

(Continued)

(52) U.S. Cl.
CPC .......... *G11C 29/787* (2013.01); *G11C 7/1009* (2013.01); *G11C 7/222* (2013.01); *G11C 8/18* (2013.01); *G11C 17/16* (2013.01); *G11C 17/165* (2013.01); *G11C 17/18* (2013.01); *G11C 29/12015* (2013.01); *G11C 29/835* (2013.01); *H03K 5/135* (2013.01); *G11C 29/027* (2013.01); *G11C 2029/0407* (2013.01); *G11C 2029/4402* (2013.01)

(58) Field of Classification Search
CPC ..... G11C 29/787; G11C 17/165; G11C 17/18; G11C 29/12015; G11C 2029/0404; H03K 5/135

See application file for complete search history.

(56) References Cited

U.S. PATENT DOCUMENTS

| | | | | |
|---|---|---|---|---|
| 2006/0193185 | A1* | 8/2006 | Takai | G11C 17/143 365/200 |
| 2007/0033449 | A1* | 2/2007 | Hwang | G11C 29/02 714/710 |

(Continued)

FOREIGN PATENT DOCUMENTS

KR    1020160074211 A    6/2016

*Primary Examiner* — Uyen B Tran
(74) *Attorney, Agent, or Firm* — William Park & Associates Ltd.

(57) ABSTRACT

A semiconductor device includes a fuse selection circuit suitable for generating fuse set address signals based on a clock signal; a fuse array including a plurality of fuse sets and suitable for sequentially outputting fuse set data from the fuse sets based on the fuse set address signals; a read circuit suitable for sequentially generating read set data based on the clock signal and the fuse set data; and a calculation circuit suitable for calculating a number of used or unused fuse sets among the fuse sets based on the clock signal and a fuse information signal which includes at least one fuse read signal among a plurality of fuse read signals included in the read set data.

22 Claims, 11 Drawing Sheets

(51) Int. Cl.
  *G11C 29/02*   (2006.01)
  *G11C 29/44*   (2006.01)

(56) References Cited

U.S. PATENT DOCUMENTS

| | | | |
|---|---|---|---|
| 2009/0109790 A1* | 4/2009 | Miyatake | G11C 17/165 |
| | | | 365/230.08 |
| 2014/0219000 A1* | 8/2014 | Oh | G11C 17/16 |
| | | | 365/96 |
| 2016/0042805 A1* | 2/2016 | Park | G11C 17/16 |
| | | | 365/96 |

\* cited by examiner

FIG. 2

| A<15> | A<14> | A<13> | A<12> | A<11> | A<10> | A<9> | A<8> | A<7> | A<6> | A<5> | A<4> | A<3> | A<2> | A<1> | A<0> |
|---|---|---|---|---|---|---|---|---|---|---|---|---|---|---|---|
| 0 | 0 | 0 | 1 | 1 | 0 | 1 | 0 | 0 | 0 | 0 | 0 | 0 | 0 | 0 | 1 |

FIG. 3

| A<15> | A<14> | A<13> | A<12> | A<11> | A<10> | A<9> | A<8> | A<7> | A<6> | A<5> | A<4> | A<3> | A<2> | A<1> | A<0> |
|---|---|---|---|---|---|---|---|---|---|---|---|---|---|---|---|
| 0 | 0 | 0 | 0 | 0 | 0 | 0 | 0 | 0 | 0 | 0 | 0 | 1 | 1 | 0 | don't care |
| 0 | 0 | 0 | 1 | 1 | 0 | 1 | 0 | 0 | 0 | 0 | 0 | don't care | don't care | 0 | 1 |

FIG. 9

| A<15> | A<14> | A<13> | A<12> | A<11> | A<10> | A<9> | A<8> | A<7> | A<6> | A<5> | A<4> | A<3> | A<2> | A<1> | A<0> |
|---|---|---|---|---|---|---|---|---|---|---|---|---|---|---|---|
| 0 | 0 | 0 | 1 | 1 | 0 | 1 | 0 | 0 | 0 | 0 | 0 | 0 | 0 | 0 | 1 |

FIG. 10

| A<15> | A<14> | A<13> | A<12> | A<11> | A<10> | A<9> | A<8> | A<7> | A<6> | A<5> | A<4> | A<3> | A<2> | A<1> | A<0> |
|---|---|---|---|---|---|---|---|---|---|---|---|---|---|---|---|
| 0 | 0 | 0 | 0 | 0 | 0 | 0 | 0 | 0 | 0 | 0 | 0 | 1 | 1 | 0 | don't care |
| 0 | 0 | 0 | 1 | 1 | 0 | 1 | 0 | 0 | 0 | 0 | 0 | don't care | don't care | 0 | 1 |

SEMICONDUCTOR DEVICE

CROSS-REFERENCE TO RELATED APPLICATION

This application claims priority under 35 U.S.C. § 119 to Korean Patent Application No. 10-2017-0101159, filed on Aug. 9, 2017 in the Korean Intellectual Property Office, the disclosure of which is incorporated herein by reference in its entirety.

TECHNICAL FIELD

Exemplary embodiments relate to a semiconductor design technology, and more particularly, to a semiconductor device.

DESCRIPTION OF THE RELATED ART

In general, a semiconductor device is designed and fabricated to include various test mode functions for testing electrical characteristics and operations. For example, a memory device detects whether a plurality of included memory cells are defective or not through a first test mode. When a defective memory cell is detected, the memory device replaces the defective memory cell with a redundancy memory cell. That is, as the defective memory cell is replaced with the redundancy memory cell, it becomes possible to repair the defective memory cell. The memory device uses a fuse and so on for repairing defective memory cells.

SUMMARY

In an embodiment, a semiconductor device may include: a fuse selection circuit suitable for generating fuse set address signals based on a clock signal; a fuse array including a plurality of fuse sets and suitable for sequentially outputting fuse set data from the fuse sets based on the fuse set address signals; a read circuit suitable for sequentially generating read set data based on the clock signal and the fuse set data; and a calculation circuit suitable for calculating a number of used or unused fuse sets among the fuse sets based on the clock signal and a fuse information signal which includes at least one fuse read signal among a plurality of fuse read signals included in the read set data.

In an embodiment, a semiconductor device may include: a fuse selection circuit suitable for generating fuse set address signals based on a clock signal; a fuse array including a plurality of fuse regions, each of which includes a plurality of fuse sets, and suitable for sequentially selecting a single fuse region among the fuse regions during a plurality of read periods and sequentially outputting fuse set data from the fuse sets for each read period, based on the fuse set address signals; a read circuit suitable for sequentially generating read set data based on the clock signal and the fuse set data; a control circuit suitable for generating a calculation control signal that is activated during a predetermined calculation period including at least one read period among the read periods, based on a plurality of fuse region selection signals and a read period identification signal; and a calculation circuit suitable for calculating a number of used or unused fuse sets among the fuse sets included in at least one fuse region among the fuse regions during the calculation period, and for calculating the number of used or unused fuse sets based on the calculation control signal, the clock signal, and a fuse information signal which includes at least one fuse read signal among a plurality of fuse read signals included in the read set data.

In an embodiment, a method for operating a semiconductor device may include: entering a boot-up mode; sequentially reading fuse set data from a plurality of fuse sets included in a fuse array whenever a clock signal toggles and sequentially generating read set data which corresponds to the fuse set data; and calculating the number of used or unused fuse sets among the fuse sets based on the clock signal and a fuse information signal which includes at least one fuse read signal among a plurality of fuse read signals included in the read set data.

In an embodiment, a method for operating a semiconductor device may include: entering a boot-up mode; sequentially selecting a plurality of fuse regions included in a fuse array during a plurality of read periods based on a clock signal, sequentially reading fuse set data from a plurality of fuse sets included in each of the fuse regions whenever the clock signal toggles, and sequentially generating read set data which corresponds to the fuse set data; and calculating the number of used fuse sets or unused fuse sets among fuse sets included in at least one fuse region among the fuse regions during a predetermined calculation period which includes at least one read period among the read periods, based on the clock signal, a read period identification signal, and a fuse information signal which includes at least one fuse read signal among a plurality of fuse read signals included in the read set data.

BRIEF DESCRIPTION OF THE DRAWINGS

FIG. 2 is a diagram to assist in an explanation of an example of a read set data and a fuse information signal shown in FIG. 1.

FIG. 3 is a diagram to assist in an explanation of another example of the read set data and the fuse information signal shown in FIG. 1.

FIG. 9 is a diagram to assist in an explanation of an example of a read set data and a fuse information signal shown in FIG. 8.

FIG. 10 is a diagram to assist in an explanation of another example of the read set data and the fuse information signal shown in FIG. 8.

DETAILED DESCRIPTION

Figure 1:
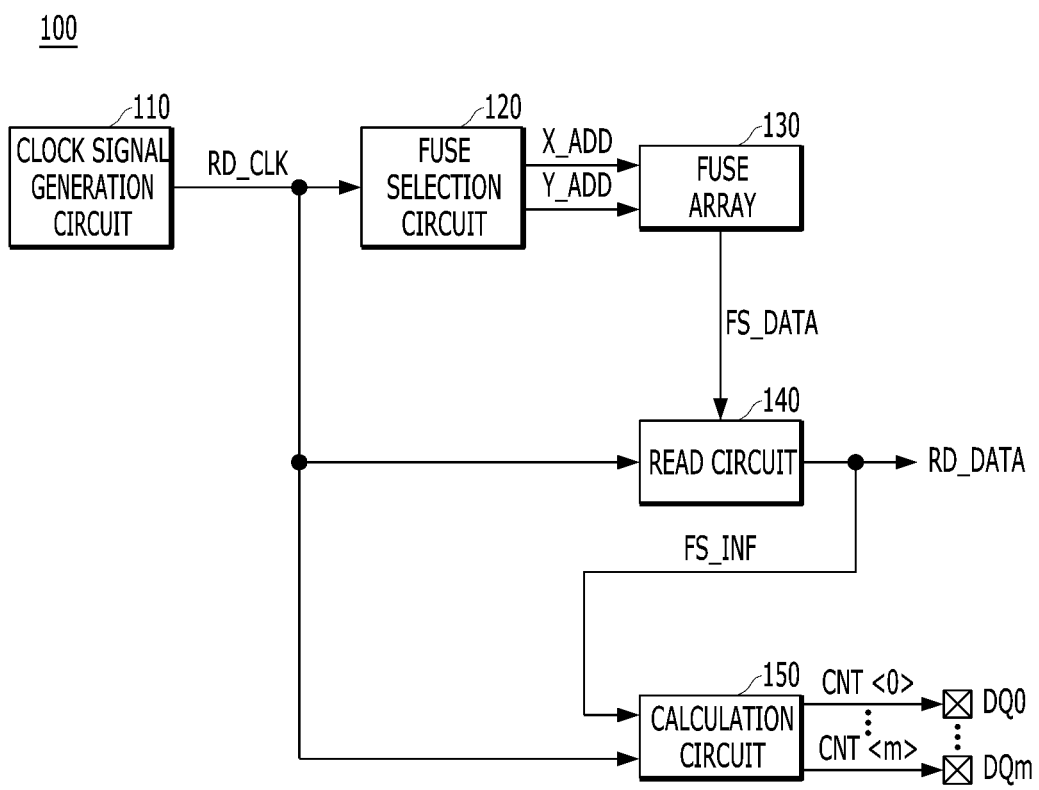
FIG. 1 is a block diagram illustrating a semiconductor device in accordance with an embodiment of the present disclosure.

Exemplary embodiments of the present disclosure will be described below in more detail with reference to the accompanying drawings. The present disclosure may, however, be embodied in different forms and should not be construed as limited to the embodiments set forth herein. Rather, these embodiments are provided so that this disclosure will be thorough and complete, and will fully convey a scope of the present disclosure to those skilled in the art. Throughout the disclosure, like reference numerals refer to like parts throughout the various figures and embodiments of the present disclosure.

FIG. 1 is a block diagram illustrating a semiconductor device in accordance with an embodiment of the present disclosure.

Referring to FIG. 1, the semiconductor device 100 may include a clock signal generation circuit 110, a fuse selection circuit 120, a fuse array 130, a read circuit 140, and a calculation circuit 150.

The clock signal generation circuit 110 may generate a clock signal RD_CLK having a predetermined cycle. For example, the clock signal generation circuit 110 may include an oscillator.

The fuse selection circuit 120 may generate fuse set address signals X_ADD and Y_ADD based on the clock signal RD_CLK. For example, the fuse selection circuit 120 may generate the fuse set address signals X_ADD and Y_ADD which are counted whenever the clock signal RD_CLK toggles. The fuse set address signals X_ADD and Y_ADD may include a row address signal X_ADD and a column address signal Y_ADD.

The fuse array 130 may include a plurality of fuse sets. The fuse array 130 may sequentially output fuse set data FS_DATA from the fuse sets based on the fuse set address signals X_ADD and Y_ADD. For example, each of the fuse sets may include first to $16^{th}$ fuses, and each of the fuse set data FS_DATA may include first to $16^{th}$ fuse signals outputted from the first to $16^{th}$ fuses. Although it is described in the embodiments of the present disclosure that each of the fuse sets includes the first to $16^{th}$ fuses and each of the fuse set data includes the first to $16^{th}$ fuse signals, the inventive concept is not limited to this.

The read circuit 140 may sequentially generate read set data RD_DATA corresponding to the fuse set data FS_DATA based on the clock signal RD_CLK. Each of the read set data RD_DATA may include first to $16^{th}$ fuse read signals A<15:0> corresponding to the first to $16^{th}$ fuse signals (Refer to FIGS. 2 and 3).

The calculation circuit 150 may calculate the number of fuse sets which are used or are not used among the plurality of fuse sets based on the clock signal RD_CLK and a fuse information signal FS_INF and output count signals CNT<m:0> to one or more pads DQ0 to DQm, where the count signals CNT<m:0> may correspond to the calculation result. The fuse information signal FS_INF may include at least one fuse read signal among the first to $16^{th}$ fuse read signals A<15:0> included in the read set data RD_DATA (Refer to FIGS. 2 and 3).

FIG. 2 is a diagram to assist in an explanation of an example of the read set data RD_DATA and the fuse information signal FS_INF shown in FIG. 1.

Referring to FIG. 2, the read set data RD_DATA may include the first to $16^{th}$ fuse read signals A<15:0>.

The fuse information signal FS_INF may indicate whether or not the plurality of fuse sets are used. For example, the fuse information signal FS_INF may include the first fuse read signal A<0> that is sequentially generated among the first to $16^{th}$ fuse read signals A<15:0> that are sequentially generated. At this time, when the first fuse read signal A<0> is a logic high level, i.e., "1", the first fuse read signal A<0> may indicate that the corresponding fuse set has been used, whereas when the first fuse read signal A<0> is a logic low level, i.e., "0", the first fuse read signal A<0> may indicate that the corresponding fuse set has not been used. In other words, the fuse information signal FS_INF may indicate whether or not each of the fuse sets is used according to a logic level of the first fuse read signal A<0>. Although it is described in the embodiments of the present disclosure that the fuse information signal FS_INF indicates whether the fuse set corresponding to the first fuse read signal A<0> among the first to $16^{th}$ fuse read signals A<15:0> is used, the inventive concept is not limited to this.

FIG. 3 is a diagram to assist in an explanation of another example of the read set data RD_DATA and the fuse information signal FS_INF shown in FIG. 1. The fuse information signal FS_INF shown in FIG. 3 is different from that shown in FIG. 1 in that the fuse information signal FS_INF shown in FIG. 3 may further include information indicating whether or not each of the fuse sets is defective.

Referring to FIG. 3, the read set data RD_DATA may include the first to $16^{th}$ fuse read signals A<15:0>.

The fuse information signal FS_INF may indicate whether or not the plurality of fuse sets are used and whether or not the plurality of fuse sets are defective. For example, the fuse information signal FS_INF may include the first fuse read signal A<0>, the third fuse read signal A<2>, and the fourth fuse read signal A<3> that are sequentially generated among the first to $16^{th}$ fuse read signals A<15:0> that are sequentially generated. The first fuse read signal A<0> may indicate whether or not the corresponding fuse set is used, and the third and fourth fuse read signals A<3:2> may indicate whether or not the corresponding fuse sets are defective. At this time, when the first fuse read signal A<0> is a logic high level, i.e., "1", the first fuse read signal A<0> may indicate that the corresponding fuse set has been used, whereas when the first fuse read signal A<0> is a logic low level, i.e., "0", the first fuse read signal A<0> may indicate that the corresponding fuse set has not been used. In other words, the fuse information signal FS_INF may indicate whether or not each of the fuse sets are used according to a logic level of the first fuse read signal A<0>. Further, when the third and fourth fuse read signals A<3:2> are of a logic high level, i.e., "11", the third and fourth fuse read signals A<3:2> may indicate that the corresponding fuse sets are defective, whereas when the third and fourth fuse read signals A<3:2> are not a logical high level, i.e., "00", "01" and "10", the third and fourth fuse read signals A<3:2> may indicate that the corresponding fuse sets are not defective. In other words, the fuse information signal FS_INF may indicate whether or not each of the fuse sets is defective according to a logic level of the third and fourth fuse read signals A<3:2>. When the corresponding fuse set is defective, it may be regarded as a used fuse set. Thus, when the first fuse read signal A<0> is "1", the selected fuse set may be classified as a used fuse set regardless of a logic level of the third and fourth fuse read signals A<3:2> (illustrated as "don't care" in FIG. 3). When the third and fourth fuse read signals A<3:2> are "11", the selected fuse sets may be classified as used ones regardless of the logic level of the first fuse read signal A<0> (illustrated as "don't care" in FIG. 3). Although it is described in the embodiments of the present disclosure that first fuse read signal A<0> among the first to $16^{th}$ fuse read signals A<15:0> indicates whether or not the corresponding fuse set is used, and the third and fourth fuse read signals A<3:2> indicate whether or not the corresponding fuse sets are defective, the inventive concept is not limited to this.

Figure 4:
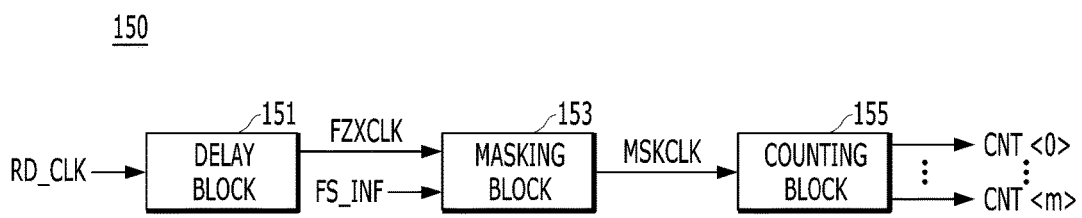
FIG. 4 is a block diagram illustrating a representation of an example of a calculation circuit shown in FIG. 1.

FIG. 4 is a block diagram illustrating a representation of an example of the calculation circuit 150 shown in FIG. 1. As described above by reference to FIG. 2, when the fuse information signal FS_INF includes the first fuse read signal A<0>, the calculation circuit 150 may be designed as shown in FIG. 4.

Referring to FIG. 4, the calculation circuit 150 may include a delay block 151, a masking block 153, and a counting block 155.

The delay block 151 may delay the clock signal RD_CLK by a predetermined delay time to generate a delayed clock signal FZXCLK. The delay time may be shorter than a single cycle of the clock signal RD_CLK.

The masking block 153 may selectively mask a toggling period of the clock signal RD_CLK based on the delayed clock signal FZXCLK and the fuse information signal FS_INF.

The counting block 155 may count a mask clock signal MSKCLK outputted from the masking block 153 to generate the count signals CNT<m:0> which may correspond to the number of used or unused fuse sets.

Figure 5:
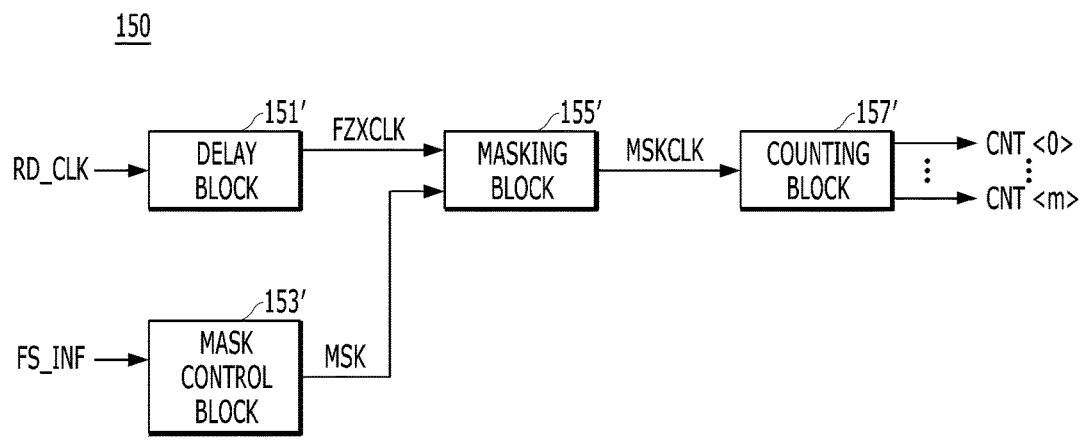
FIG. 5 is a block diagram illustrating a representation of another example of the calculation circuit shown in FIG. 1.

FIG. 5 is a block diagram illustrating a representation of another example of the calculation circuit 150 shown in FIG. 1. As described above by reference to FIG. 3, when the fuse information signal FS_INF includes the first fuse read signal A<0> and the third and fourth fuse read signals A<3:2>, the calculation circuit 150 may be designed as shown in FIG. 5.

Referring to FIG. 5, the calculation circuit 150 may include a delay block 151', a mask control block 153', a masking block 155', and a counting block 157'.

The delay block 151' may delay the clock signal RD_CLK by a predetermined delay time to generate a delayed clock signal FZXCLK. The delay time may be shorter than a single cycle of the clock signal RD_CLK.

The mask control block 153' may generate a mask information signal MSK which corresponds to whether or not the plurality of fuse sets are used, or whether the plurality of fuse sets are defective, based on the fuse information signal FS_INF.

The masking block 155' may selectively mask a toggling period of the clock signal RD_CLK based on the delayed clock signal FZXCLK and the mask information signal MSK.

The counting block 157' may count a mask clock signal MSKCLK outputted from the masking block 155' to generate the count signals CNT<m:0> which corresponds to the number of used or unused fuse sets.

Figure 6:
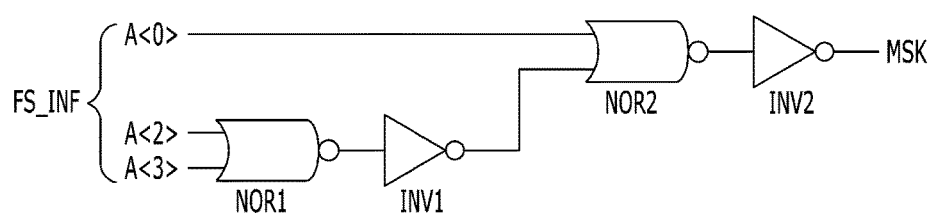
FIG. 6 is a circuit diagram illustrating a representation of an example of a mask control block shown in FIG. 5.

FIG. 6 is a circuit diagram illustrating a representation of an example of the mask control block 153' shown in FIG. 5.

Referring to FIG. 6, the mask control block 153' may include a first NOR gate NOR1, a first inverter INV1, a second NOR gate NOR2, and a second inverter INV2.

The first NOR gate NOR1 may perform a NOR operation on the third and fourth fuse read signals A<3:2>. The first inverter INV1 may invert an output signal of the first NOR gate NOR1. The second NOR gate NOR2 may perform a NOR operation on an output signal of the first inverter INV1 and the first fuse read signal A<0>. The second inverter INV2 may invert an output signal of the second NOR gate NOR2 to output the mask information signal MSK.

Figure 7:
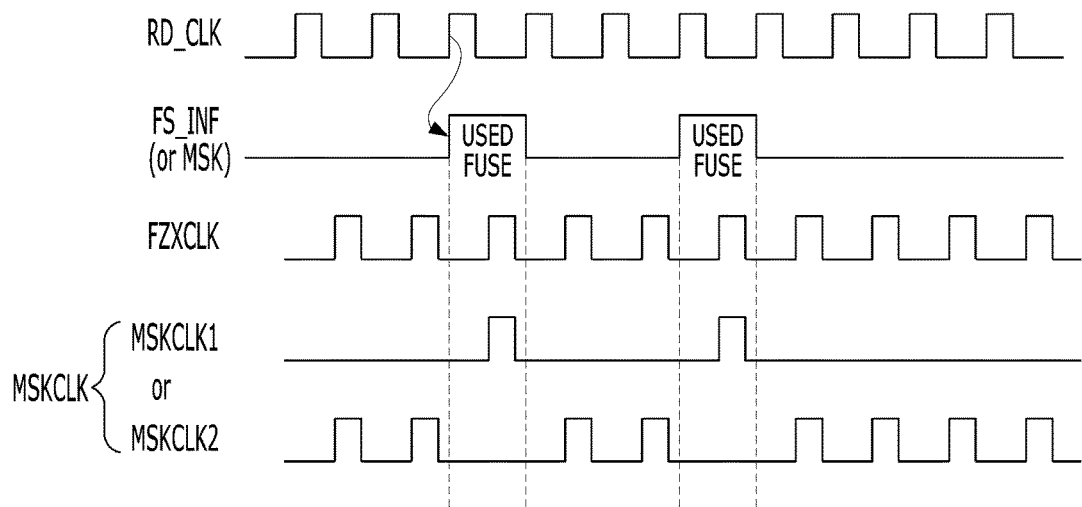
FIG. 7 is a timing diagram to assist in an explanation of an operation of the semiconductor device shown in FIG. 1.

FIG. 7 is a timing diagram to assist in an explanation of an operation of the semiconductor device 100 shown in FIG. 1.

Referring to FIG. 7, the semiconductor device 100 may sequentially read the read set data RD_DATA in a boot-up mode from a plurality of fuse sets included in the fuse array 130 and simultaneously calculate a number of used or unused fuse sets among the plurality of fuse sets. Detailed descriptions thereon are provided below.

When the semiconductor device 100 enters the boot-up mode, the clock signal generation circuit 110 may generate the clock signal RD_CLK. The fuse selection circuit 120 may sequentially generate the fuse set address signals X_ADD and Y_ADD whenever the clock signal RD_CLK toggles. The fuse array 130 may sequentially generate the fuse set data FS_DATA from the plurality of fuse sets based on the fuse set address signals X_ADD and Y_ADD. The read circuit 140 may sequentially generate the read set data RD_DATA based on the clock signal RD_CLK and the fuse set data FS_DATA. The read set data RD_DATA may include the fuse information signal FS_INF indicating whether or not the plurality of fuse sets are used. For example, the fuse information signal FS_INF may include the first fuse read signal A<0> corresponding to the lowermost bit among the first to $16^{th}$ fuse read signals included in the read set data RD_DATA. When the corresponding fuse set is used, the first fuse read signal A<0> may have a logic high level, i.e., "1", and hence the fuse information signal FS_INF may also have a logic high level, i.e., "1". When the corresponding fuse set is not used, the first fuse read signal A<0> may have a logic low level, i.e., "0", and hence the fuse information signal FS_INF may also have a logic low level, i.e., "0".

The calculation circuit 150 may output the count signals CNT<m:0> corresponding to the number of used or unused fuse sets to one or more pads DQ0 to DQm based on the clock signal RD_CLK and the fuse information signal FS_INF.

For example, the delay block 151 may delay the clock signal RD_CLK by the delay time to generate the delayed clock signal FZXCLK. The delay time may be shorter than a single cycle of the clock signal RD_CLK. The masking block 153 may generate the mask clock signal MSKCLK based on the delayed clock signal FZXCLK and the fuse information signal FS_INF. For example, the masking block 153 may output a first mask clock signal MSKCLK1 generated by masking the delayed clock signal FZXCLK as the mask clock signal MSKCLK while the fuse information signal FS_INF is a logic low level, i.e., "0". The first mask clock signal MSKCLK1 may correspond to the number of used fuse sets among the plurality of fuse sets. The masking block 153 may output a second mask clock signal MSKCLK2 generated by masking the delayed clock signal FZXCLK as the mask clock signal MSKCLK while the fuse information signal FS_INF is a logic high level, i.e., "1". The second mask clock signal MSKCLK2 may correspond to the number of unused fuse sets among the plurality of fuse sets. The counting block 155 may count the mask clock signals MSKCLK to generate count signals CNT<m:0> corresponding to the number of used or unused fuse sets.

The delay block 151' may delay the clock signal RD_CLK by the delay time to generate the delayed clock signal FZXCLK. The delay time may be shorter than a single cycle of the clock signal RD_CLK. The mask control block 153' may generate the mask information signal MSK corresponding to whether or not the plurality of fuse sets are used and whether or not the plurality of fuse sets are defective based on the fuse information signal FS_INF. The masking block 155' may generate the mask clock signal MSKCLK based on the delayed clock signal FZXCLK and the mask information signal MSK. For example, the masking block 155' may output a first mask clock signal MSKCLK1 generated by masking the delayed clock signal FZXCLK as the mask clock signal MSKCLK while the mask information signal MSK is a logic low level, i.e., "0". The first mask clock signal MSKCLK1 may correspond to the number of used fuse sets among the plurality of fuse sets. The masking block 155' may output a second mask clock signal MSKCLK2 generated by masking the delayed clock signal FZXCLK as the mask clock signal MSKCLK while the mask information signal MSK is a logic high level, i.e., "1". The second mask clock signal MSKCLK2 may correspond to the number of unused fuse sets among the plurality of fuse sets. The counting block 157' may count the mask clock signal MSKCLK to generate count signals CNT<m:0> corresponding to the number of used or unused fuse sets.

In accordance with an embodiment as described above, there is an advantage in that it is possible to easily calculate the number of used or unused fuse sets among a plurality of fuse sets.

Figure 8:
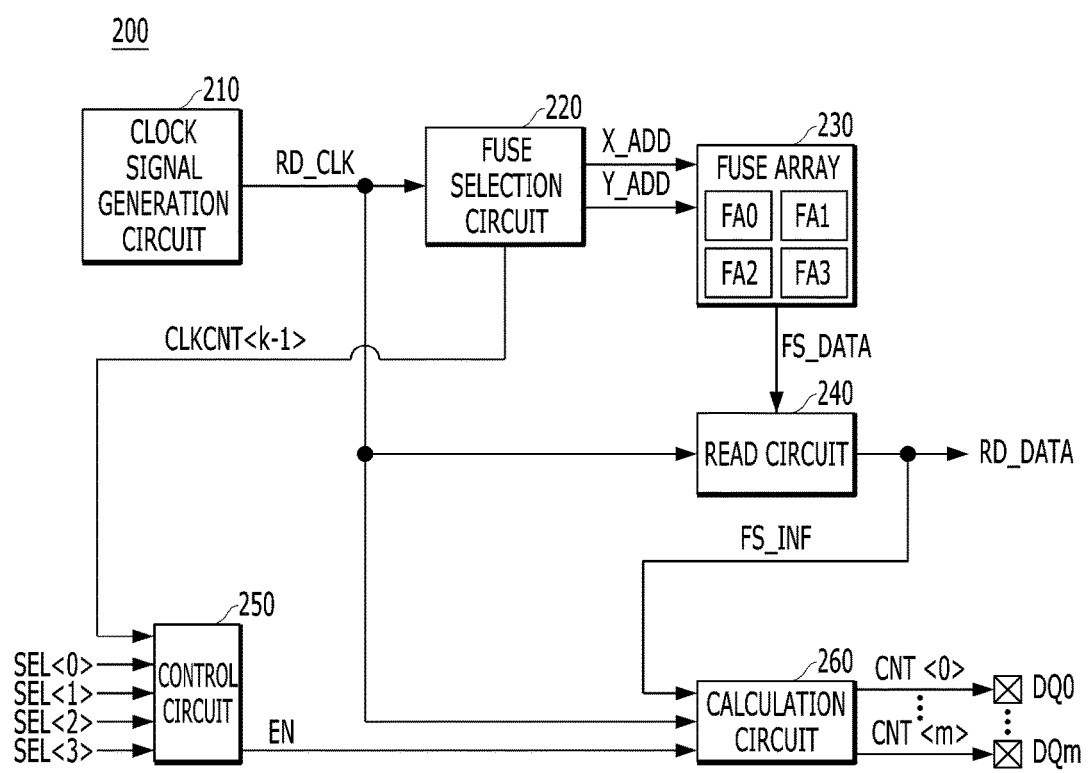
FIG. 8 is a block diagram illustrating a semiconductor device in accordance with another embodiment of the present disclosure.

FIG. 8 is a block diagram illustrating a semiconductor device in accordance with another embodiment of the present disclosure.

Referring to FIG. 8, the semiconductor device 200 may include a clock signal generation circuit 210, a fuse selection circuit 220, a fuse array 230, a read circuit 240, a control circuit 250, and a calculation circuit 260.

The clock signal generation circuit 210 may generate a clock signal RD_CLK having a predetermined cycle. For example, the clock signal generation circuit 210 may include an oscillator.

The fuse selection circuit 220 may generate fuse set address signals X_ADD and Y_ADD based on the clock signal RD_CLK. For example, the fuse selection circuit 220 may generate the fuse set address signals X_ADD and Y_ADD which are counted whenever the clock signal RD_CLK toggles. The fuse set address signals X_ADD and Y_ADD may include a row address signal X_ADD and a column address signal Y_ADD.

The fuse array 230 may include first to fourth fuse regions FA0, FA1, FA2, and FA3. Each of the first to fourth fuse regions FA0, FA1, FA2, and FA3 may include a plurality of fuse sets. The fuse array 230 may sequentially select one fuse region among the first to fourth fuse regions FA0, FA1, FA2, and FA3 during first to fourth read periods and sequentially output a fuse set data FS_DATA from the fuse sets for each read period based on the fuse set address signals X_ADD and Y_ADD. For example, each of the fuse sets may include first to $16^{th}$ fuses, and each of the fuse set data FS_DATA may include first to $16^{th}$ fuse signals outputted from the first to $16^{th}$ fuses. Although it is described in the embodiments of the present disclosure that the fuse array 230 includes the first to fourth fuse regions FA0, FA1, FA2, and FA3, and each of the fuse sets includes the first to $16^{th}$ fuses, and each of the fuse set data includes the first to $16^{th}$ fuse signals, the inventive concept is not limited to this.

The read circuit 240 may sequentially generate read set data RD_DATA corresponding to the fuse set data FS_DATA based on the clock signal RD_CLK. Each of the read set data RD_DATA may include first to $16^{th}$ fuse read signals A<15:0> corresponding to the first to $16^{th}$ fuse signals (Refer to FIGS. 9 and 10).

The control circuit 250 may generate a calculation control signal EN that is activated during a predetermined calculation period based on first to fourth fuse region selection signals SEL<3:0> and a read period identification signal CLKCNT<k−1>. Each of the first to fourth fuse region selection signals SEL<3:0> may include a test mode signal or a mode register set signal. The read period identification signal CLKCNT<k−1> may include a single divided clock signal among first to $k^{th}$ divided clock signals CLKCNT<k−1:0>, which is described below. For example, the single divided clock signal may include a $k^{th}$ divided clock signal among first to $k^{th}$ divided clock signals CLKCNT<k−1:0>. The calculation period may include at least one read period among the first to fourth read periods. For example, the single divided clock signal may include a $k^{th}$ single divided clock signal among the first to $k^{th}$ divided clock signals CLKCNT<k−1:0>.

The calculation circuit 260 may calculate the number of fuse sets which are used or are not used among the plurality of fuse sets included in at least one fuse region during the calculation period based on the calculation control signal EN, the clock signal RD_CLK, and a fuse information signal FS_INF. Further, the calculation circuit 260 may output count signals CNT<m:0> corresponding to the calculation result to one or more pads DQ0 to DQm. The fuse information signal FS_INF may include at least one fuse read signal among the first to $16^{th}$ fuse read signals A<15:0> included in the read set data RD_DATA (Refer to FIGS. 9 and 10).

FIG. 9 is a diagram to assist in an explanation of an example of the read set data RD_DATA and the fuse information signal FS_INF shown in FIG. 8.

Referring to FIG. 9, the read set data RD_DATA may include the first to $16^{th}$ fuse read signals A<15:0>.

The fuse information signal FS_INF may indicate whether or not the plurality of fuse sets are used. For example, the fuse information signal FS_INF may include the first fuse read signal A<0> that is sequentially generated among the first to $16^{th}$ fuse read signals A<15:0> that are sequentially generated. At this time, when the first fuse read signal A<0> is a logic high level, i.e., "1", the first fuse read signal A<0> may indicate that the corresponding fuse set has been used, whereas when the first fuse read signal A<0> is a logic low level, i.e., "0", the first fuse read signal A<0> may indicate that the corresponding fuse set has not been used. Although it is described in the embodiments of the present disclosure that the fuse information signal FS_INF indicates whether or not the fuse set corresponding to the first fuse read signal A<0> among the first to $16^{th}$ fuse read signals A<15:0> is used, the inventive concept is not limited to this.

FIG. 10 is a diagram to assist in an explanation of another example of the RD_DATA and the fuse information signal FS_INF shown in FIG. 8.

Referring to FIG. 10, the read set data RD_DATA may include the first to $16^{th}$ fuse read signals A<15:0>.

The fuse information signal FS_INF may indicate whether or not the plurality of fuse sets are used and whether or not the plurality of fuse sets are defective. For example, the fuse information signal FS_INF may include the first fuse read signal A<0>, the third fuse read signal A<2>, and the fourth fuse read signal A<3> that are sequentially generated among the first to 16$^{th}$ fuse read signals A<15:0> that are sequentially generated. The first fuse read signal A<0> may indicate whether or not the corresponding fuse set is used, and the third and fourth fuse read signals A<3:2> may indicate whether the corresponding fuse sets are defective. At this time, when the first fuse read signal A<0> is a logic high level, i.e., "1", the first fuse read signal A<0> may indicate that the corresponding fuse set has been used, whereas when the first fuse read signal A<0> is a logic low level, i.e., "0", the first fuse read signal A<0> may indicate that the corresponding fuse set has not been used. Further, when the third and fourth fuse read signals A<3:2> are of a logic high level, i.e., "11", the third and fourth fuse read signals A<3:2> may indicate that the corresponding fuse sets are defective, whereas when the third and fourth fuse read signals A<3:2> are not a logical high level, i.e., "00", "01" and "10", the third and fourth fuse read signals A<3:2> may indicate that the corresponding fuse sets are not defective. When the corresponding fuse set is defective, it may be regarded as a used fuse set. Thus, when the first fuse read signal A<0> is "1" or the third and fourth fuse read signals A<3:2> are "11", the selected fuse set may be classified as a used one. Although it is described in the embodiments of the present disclosure that first fuse read signal A<0> among the first to 16$^{th}$ fuse read signals A<15:0> indicates whether or not the corresponding fuse set is used, and the third and fourth fuse read signals A<3:2> indicate whether or not the corresponding fuse sets are defective, the inventive concept is not limited to this.

Figure 11:
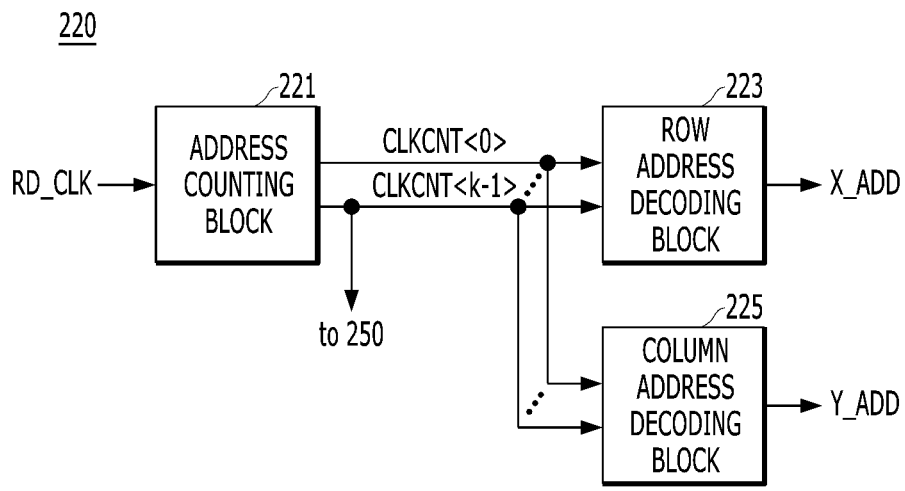
FIG. 11 is a block diagram illustrating a representation of an example of a fuse selection circuit shown in FIG. 8.

FIG. 11 is a block diagram illustrating a representation of an example of the fuse selection circuit 220 shown in FIG. 8.

Referring to FIG. 11, the fuse selection circuit 220 may include an address counting block 221, a row address decoding block 223, and a column address decoding block 225.

The address counting block 221 may generate first to k$^{th}$ divided clock signals CLKCNT<k−1:0> that are divided at a predetermined division ratio based on the clock signal RD_CLK.

The row address decoding block 223 may generate the row address signal X_ADD for sequentially selecting each of the fuse sets based on the first to k$^{th}$ divided clock signals CLKCNT<k−1:0>.

The column address decoding block 225 may generate the column address signal Y_ADD for sequentially selecting each of the fuse sets based on the first to k$^{th}$ divided clock signals CLKCNT<k−1:0>.

Figure 12:
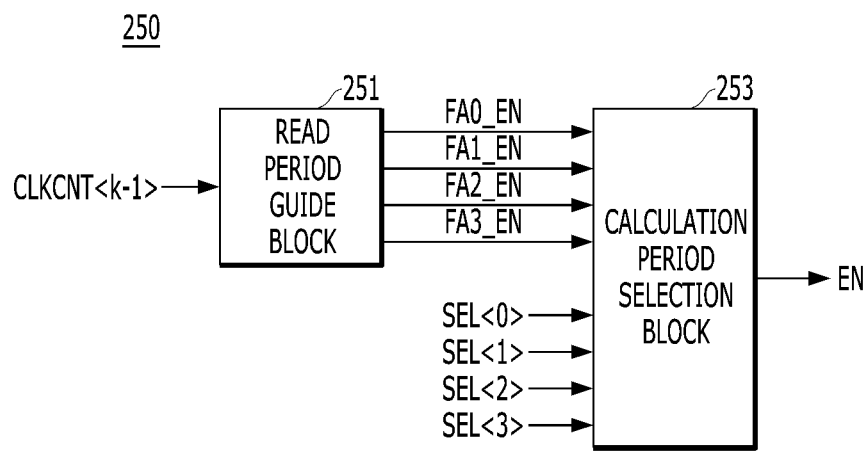
FIG. 12 is a block diagram illustrating a representation of an example of a control circuit shown in FIG. 8.

FIG. 12 is a block diagram illustrating a representation of an example of the control circuit 250 shown in FIG. 8.

Referring to FIG. 12, the control circuit 250 may include a read period guide block 251 and a calculation period selection block 253.

The read period guide block 251 may generate first to fourth read period guide signals FA0_EN, FA1_EN, FA2_EN, and FA3_EN which correspond to the first to fourth read periods based on the read period identification signal CLKCNT<k−1>.

The calculation period selection block 253 may generate the calculation control signal EN based on the first to fourth read period guide signals FA0_EN, FA1_EN, FA2_EN, and FA3_EN and the first to fourth fuse region selection signals SEL<3:0>.

Figure 13:
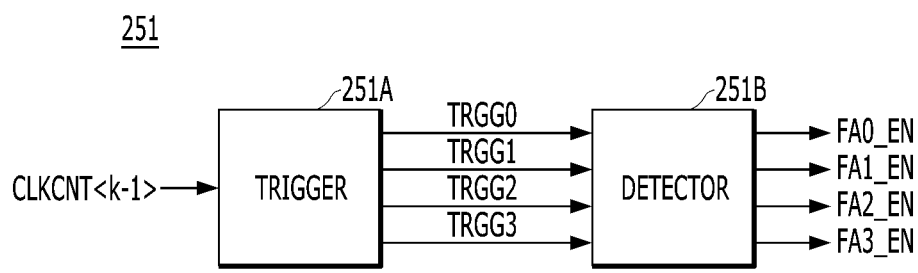
FIG. 13 is a block diagram illustrating a representation of an example of a read period guide block shown in FIG. 12.

FIG. 13 is a block diagram illustrating a representation of an example of the read period guide block 251 shown in FIG. 12.

Referring to FIG. 13, the read period guide block 251 may include a trigger 251A and a detector 251B.

The trigger 251A may detect an edge of the read period identification signal CLKCNT<k−1> and generate first to fourth edge detection signals TRGG0 to TRGG3 corresponding to the detection result.

The detector 251B may generate the first to fourth read period guide signals FA0_EN, FA1_EN, FA2_EN, and FA3_EN based on the first to fourth edge detection signals TRGG0 to TRGG3.

Figure 14:
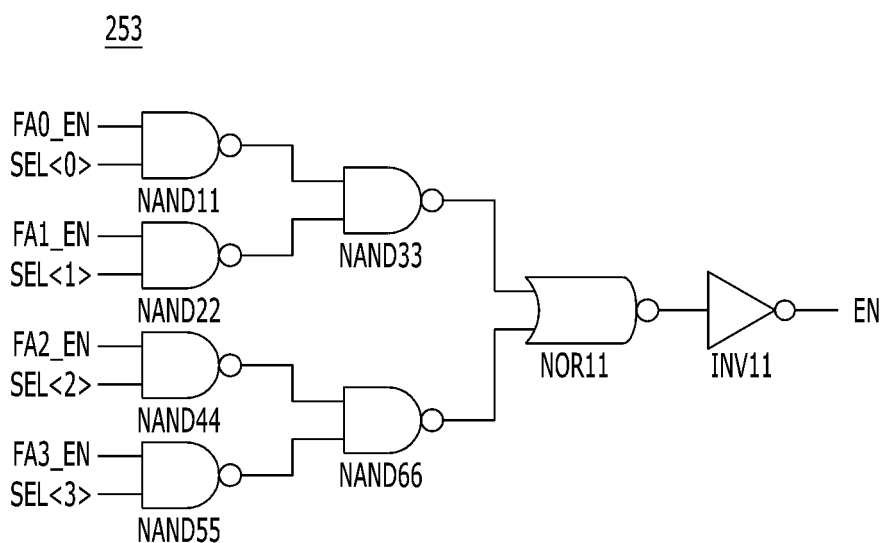
FIG. 14 is a circuit diagram illustrating a representation of an example of a calculation period selection block shown in FIG. 12.

FIG. 14 is a circuit diagram illustrating a representation of an example of the calculation period selection block 253 shown in FIG. 12.

Referring to FIG. 14, the calculation period selection block 253 may include a first NAND gate NAND11, a second NAND gate NAND22, a third NAND gate NAND33, a fourth NAND gate NAND44, a fifth NAND gate NAND55, a sixth NAND gate NAND66, a first NOR gate NOR11, and a first inverter INV11.

The first NAND gate NAND11 may perform a NAND operation on the first read period guide signal FA0_EN and the first fuse region selection signal SEL<0>. The second NAND gate NAND22 may perform a NAND operation on the second read period guide signal FA1_EN and the second fuse region selection signal SEL<1>. The third NAND gate NAND33 may operation a NAND operation on an output signal of the first NAND gate NAND11 and an output signal of the second NAND gate NAND22. The fourth NAND gate NAND44 may perform a NAND operation on the third read period guide signal FA2_EN and the third fuse region selection signal SEL<2>. The fifth NAND gate NAND55 may perform a NAND operation on the fourth read period guide signal FA3_EN and the fourth fuse region selection signal SEL<3>. The sixth NAND gate NAND66 may perform a NAND operation on an output signal of the fourth NAND gate NAND44 and an output signal of the fifth NAND gate NAND55. The first NOR gate NOR11 may perform a NOR operation on an output signal of the third NAND gate NAND33 and an output signal of the sixth NAND gate NAND66. The first inverter INV11 may invert an output signal of the first NOR gate NOR11 to generate the calculation control signal EN.

Figure 15:
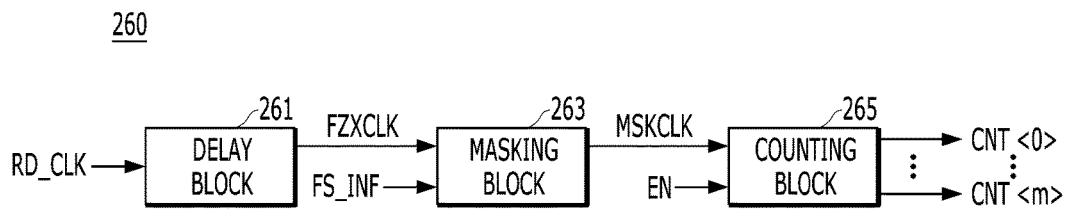
FIG. 15 is a block diagram illustrating a representation of an example of a calculation circuit shown in FIG. 8.

FIG. 15 is a block diagram illustrating a representation of an example of the calculation circuit 260 shown in FIG. 8. As described above by reference to FIG. 9, when the fuse information signal FS_INF includes the first fuse read signal A<0>, the calculation circuit 260 may be designed as shown in FIG. 15.

Referring to FIG. 15, the calculation circuit 260 may include a delay block 261, a masking block 263, and a counting block 265.

The delay block 261 may delay the clock signal RD_CLK by a predetermined delay time to generate a delayed clock signal FZXCLK. The delay time may be shorter than a single cycle of the clock signal RD_CLK.

The masking block 263 may selectively mask a toggling period of the clock signal RD_CLK based on the delayed clock signal FZXCLK and the fuse information signal FS_INF. The masking block 263 may mask the toggling period of the delayed clock signal FZXCLK to generate the mask clock signal MSKCLK. The masking block 263 may output the mask clock signal MSKCLK to the counting block 265.

The counting block 265 may count the mask clock signal MSKCLK during the calculation period to generate the count signals CNT<m:0> which correspond to the number of used or unused fuse sets based on the calculation control signal EN.

Figure 16:
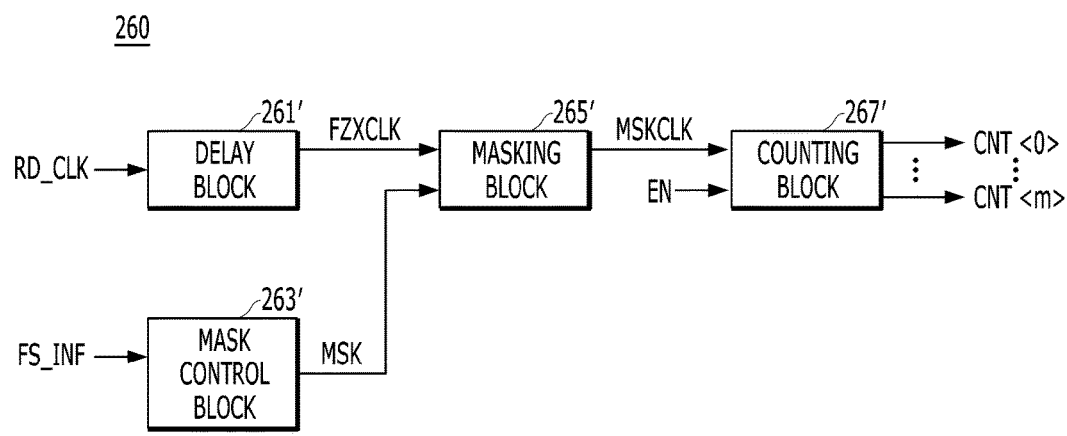
FIG. 16 is a block diagram illustrating a representation of another example of the calculation circuit shown in FIG. 8.

FIG. 16 is a block diagram illustrating a representation of another example of the calculation circuit 260 shown in FIG. 8. As described above by reference to FIG. 10, when the fuse information signal FS_INF includes the first fuse read signal A<0> and the third and fourth fuse read signals A<3:2>, the calculation circuit 260 may be designed as shown in FIG. 16.

Referring to FIG. 16, the calculation circuit 260 may include a delay block 261', a mask control block 263', a masking block 265', and a counting block 267'.

The delay block 261' may delay the clock signal RD_CLK by a predetermined delay time to generate a delayed clock signal FZXCLK. The delay time may be shorter than a single cycle of the clock signal RD_CLK.

The mask control block 263' may generate a mask information signal MSK which corresponds to whether or not the plurality of fuse sets are used, or whether or not the plurality of fuse sets are defective, based on the fuse information signal FS_INF.

The masking block 265' may selectively mask a toggling period of the clock signal RD_CLK based on the delayed clock signal FZXCLK and the mask information signal MSK.

The counting block 267' may count a mask clock signal MSKCLK outputted from the masking block 265' during the calculation period to generate the count signals CNT<m:0> which correspond to the number of the used or unused fuse sets.

Figure 17:
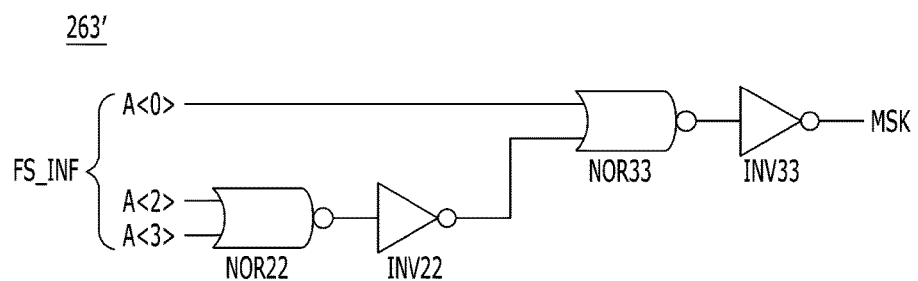
FIG. 17 is a circuit diagram illustrating a representation of an example of a mask control block shown in FIG. 16.

FIG. 17 is a circuit diagram illustrating a representation of an example of the mask control block 263' shown in FIG. 16.

Referring to FIG. 17, the mask control block 263' may include a second NOR gate NOR22, a second inverter INV22, a third NOR gate NOR33, and a third inverter INV33.

The second NOR gate NOR22 may perform a NOR operation on the third and fourth fuse read signals A<3:2>. The second inverter INV22 may invert an output signal of the second NOR gate NOR22. The third NOR gate NOR33 may perform a NOR operation on the first fuse read signal A<0> and an output signal of the second inverter INV22. The third inverter INV33 may invert an output signal of the third NOR gate NOR33 to output the mask information signal MSK.

Figure 18:
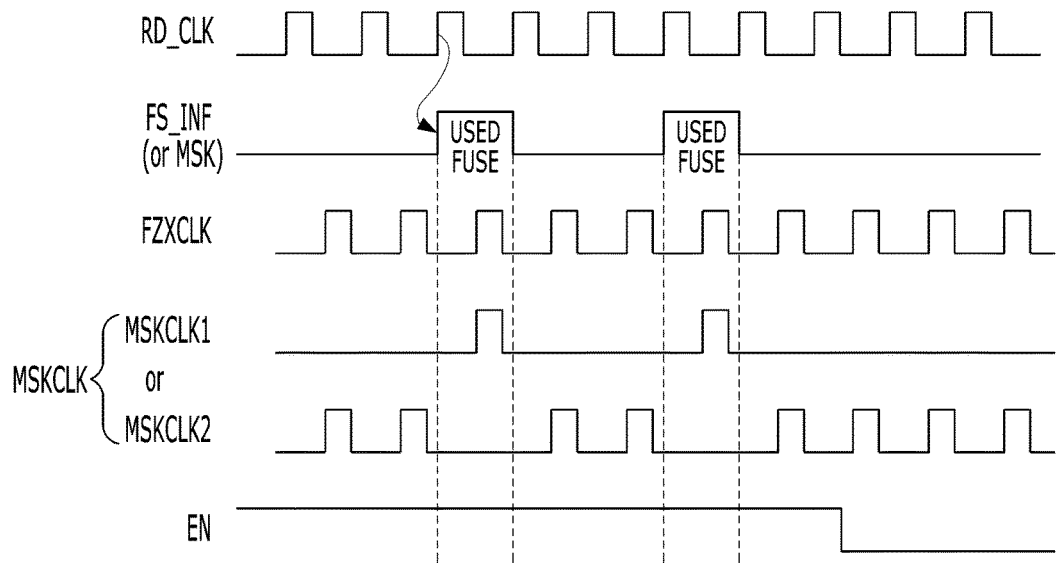
FIG. 18 is a timing diagram to assist in an explanation of an operation of the semiconductor device shown in FIG. 8.

FIG. 18 is a timing diagram to assist in an explanation of an operation of the semiconductor device 200 shown in FIG. 8.

Referring to FIG. 18, the semiconductor device 200 may sequentially select one of the first to fourth fuse regions FA0, FA1, FA2, and FA3 included in the fuse array 230 and sequentially read the read set data RD_DATA in a boot-up mode from a plurality of fuse sets included in each of the first to fourth fuse regions FA0, FA1, FA2, and FA3. Simultaneously, the semiconductor device 200 may calculate the number of used or unused fuse sets fuse sets among the plurality of fuse sets included in at least one fuse region of the first to fourth fuse regions FA0, FA1, FA2, and FA3 during the calculation period. Detailed descriptions thereon are provided below.

When semiconductor device 200 enters the boot-up mode, the clock signal generation circuit 210 may generate a clock signal RD_CLK. The fuse selection circuit 220 may sequentially generate fuse set address signals X_ADD and Y_ADD whenever the clock signal RD_CLK toggles. The fuse array 230 may sequentially select first to fourth fuse regions FA0, FA1, FA2, and FA3 during the first to fourth read periods based on the fuse set address signals X_ADD and Y_ADD and sequentially generate fuse set data FS_DATA from the plurality of fuse sets included in each of the fuse regions during each of the read periods. In other words, the fuse set data FS_DATA may be sequentially read from the fuse sets included in the fuse array 230 whenever the clock signal RD_CLK toggles. The read circuit 240 may sequentially generate the read set data RD_DATA based on the clock signal RD_CLK and the fuse set data FS_DATA. That is, the read circuit 240 may sequentially generate the read set data RD_DATA which corresponds to the fuse set data DATA.

The read set data RD_DATA may include the fuse information signal FS_INF indicating whether or not the plurality of fuse sets are used and/or whether or not the plurality of fuse sets are defective. For example, the fuse information signal FS_INF may include the first fuse read signal A<0> indicating whether or not the plurality of fuse sets are used, and the third and fourth fuse read signals A<3:2> indicating whether or not the plurality of fuse sets are defective among the first to $16^{th}$ fuse read signals included in the read set data RD_DATA. When the corresponding fuse set is used, the first fuse read signal A<0> may have a logic high level, i.e., "1" or the third and fourth fuse read signals A<3:2> may have a logic high level, i.e., "11", and hence the fuse information signal FS_INF may also have a logic high level, i.e., "1". When the corresponding fuse set is not used, the first fuse read signal A<0> may have a logic low level, i.e., "0" or the third and fourth fuse read signals A<3:2> may have logic levels, i.e., "00", "01" or "10," other than the logic high level, i.e., "11", and hence the fuse information signal FS_INF may have a logic low level, i.e., "0".

Simultaneously, the control circuit 250 may generate the calculation control signal EN that is activated during the calculation period based on the first to fourth fuse region selection signals SEL<3:0> and the read period identification signal CLKCNT<k−1>. Each of the first to fourth fuse region selection signals SEL<3:0> may include a test mode signal or a mode register set signal. The read period identification signal CLKCNT<k−1> may include a single divided clock signal among the first to $k^{th}$ divided clock signals CLKCNT<k−1:0> that are generated from the fuse selection circuit 220 (Refer to FIG. 19). The calculation period may include at least one read period among the first to fourth read periods and may be defined according to the first to fourth fuse region selection signals SEL<3:0>. The calculation circuit 260 may calculate the number of used or unused fuse sets among the fuse sets included in at least one fuse region among the first to fourth fuse regions FA0, FA1, FA2, and FA3 during the calculation period based on the clock signal RD_CLK, the fuse information signal FS_INF, and the calculation control signal EN. The calculation circuit 260 may also output the count signals CNT<m:0> corresponding to the calculation result to one or more pads DQ0 to DQm. For example, when the calculation period includes the first and second read periods corresponding to the first and second fuse regions FA0 and FA1, the calculation circuit 260 may calculate the number of used or unused fuse sets among the fuse sets included in the first and second fuse regions FA0 and FA1. Detailed descriptions of an operation of the calculation circuit 260 are provided below.

For example, the delay block 261 may delay the clock signal RD_CLK by the delay time to generate the delayed clock signal FZXCLK. The delay time may be shorter than a single cycle of the clock signal RD_CLK. The masking block 263 may generate the mask clock signal MSKCLK based on the delayed clock signal FZXCLK and the fuse information signal FS_INF. For example, the masking block 263 may output a first mask clock signal MSKCLK1 generated by masking the delayed clock signal FZXCLK as the mask clock signal MSKCLK while the fuse information signal FS_INF is a logic low level, i.e., "0". The first mask clock signal MSKCLK1 may correspond to the number of used fuse sets among the plurality of fuse sets. The masking block 263 may output a second mask clock signal MSKCLK2 generated by masking the delayed clock signal FZXCLK as the mask clock signal MSKCLK while the fuse information signal FS_INF is a logic high level, i.e., "1". The second mask clock signal MSKCLK2 may correspond to the number of unused fuse sets among the plurality of fuse sets. The counting block 265 may count the mask clock signal MSKCLK to generate count signals CNT<m:0> corresponding to the number of used or unused fuse sets based on the calculation control signal EN.

The delay block 261' may delay the clock signal RD_CLK by the delay time to generate the delayed clock signal FZXCLK. The delay time may be shorter than a single cycle of the clock signal RD_CLK. The mask control block 263' may generate the mask information signal MSK corresponding to whether or not the plurality of fuse sets are used and whether or not the plurality of fuse sets are defective based on the fuse information signal FS_INF. The masking block 265' may generate the mask clock signal MSKCLK based on the delayed clock signal FZXCLK and the mask information signal MSK. For example, the masking block 265' may output a first mask clock signal MSKCLK1 generated by masking the delayed clock signal FZXCLK as the mask clock signal MSKCLK while the mask information signal MSK is a logic low level, i.e., "0". The first mask clock signal MSKCLK1 may correspond to the number of used fuse sets among the plurality of fuse sets. The masking block 265' may output a second mask clock signal MSKCLK2 generated by masking the delayed clock signal FZXCLK as the mask clock signal MSKCLK while the mask information signal MSK is a logic high level, i.e., "1". The second mask clock signal MSKCLK2 may correspond to the number of unused fuse sets among the plurality of fuse sets. The counting block 267' may count the mask clock signal MSKCLK during the calculation period to generate count signals CNT<m:0> corresponding to the number of used or unused fuse sets based on the calculation control signal EN.

Figure 19:
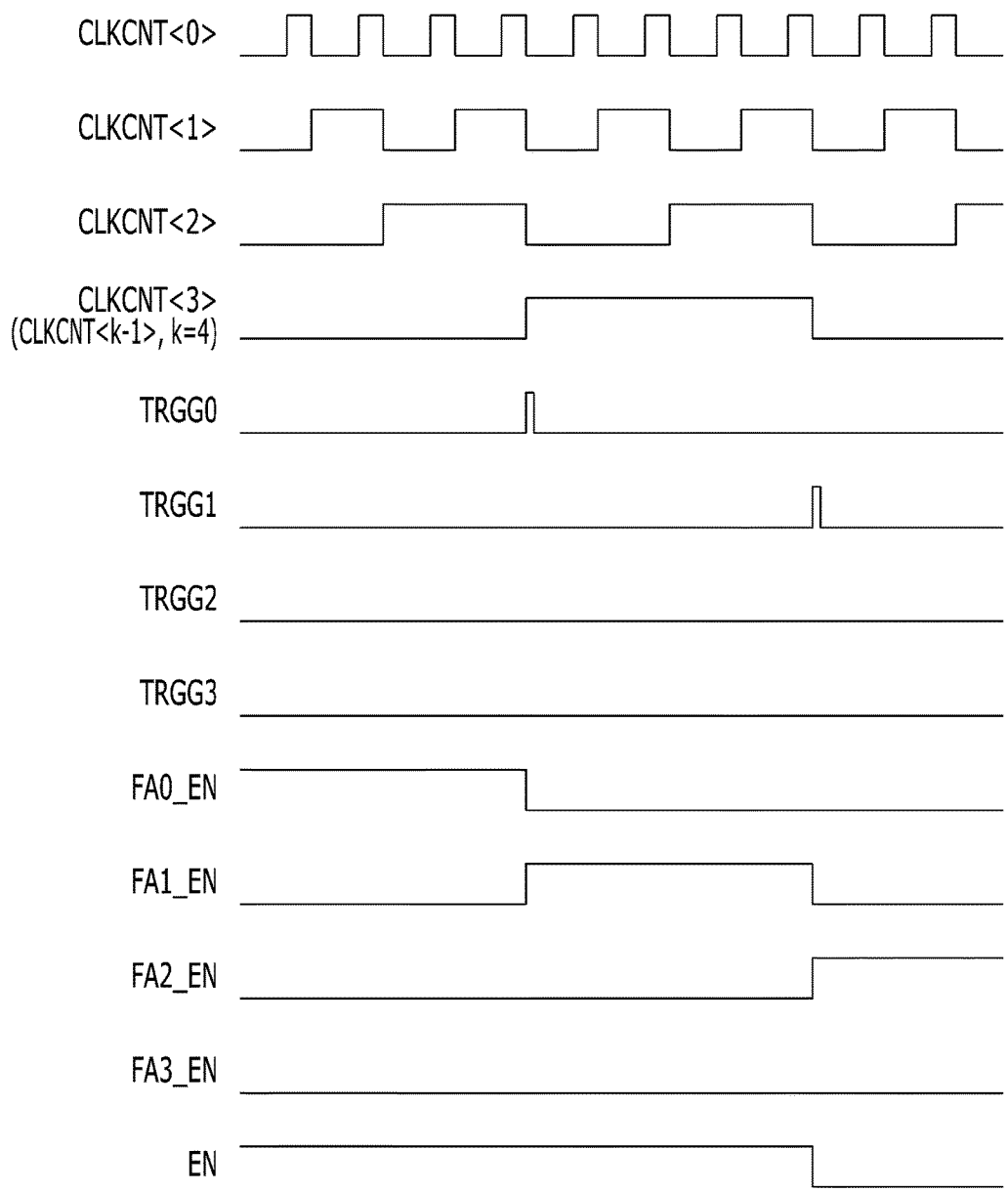
FIG. 19 is a timing diagram to assist in an explanation of a generation process of a calculation control signal shown in FIG. 18.

FIG. 19 is a timing diagram for assisting in an explanation of a generation process of the calculation control signal EN shown in FIG. 18.

Referring to FIG. 19, the fuse selection circuit 220 may generate the first to $k^{th}$ divided clock signals CLKCNT<k-1:0> by dividing the clock signal RD_CLK at a predetermined division ratio and may generate the row address signal X_ADD and the column address signal Y_ADD based on the first to $k^{th}$ divided clock signals CLKCNT<k-1:0>. The $k^{th}$ divided clock signal CLKCNT<k-1> may be used as the read period identification signal CLKCNT<k-1>.

The read period guide block 251 may generate the first to fourth read period guide signals FA0_EN, FA1_EN, FA2_EN, and FA3_EN corresponding to the first to fourth read periods based on the read period identification signal CLKCNT<k-1>. For example, the trigger 251A may detect an edge of the read period identification signal CLKCNT<k-1> and may generate the first to fourth edge detection signals TRGG0 to TRGG3 corresponding to the detection result. The detector 251B may generate the first to fourth read period guide signals FA0_EN, FA1_EN, FA2_EN, and FA3_EN based on the first to fourth edge detection signals TRGG0 to TRGG3. Each of the first to fourth read periods may correspond to a period of a logic high level where each of the first to fourth read period guide signals FA0_EN, FA1_EN, FA2_EN, and FA3_EN is activated.

The calculation period selection block 253 may generate the calculation control signal EN based on the first to fourth read period guide signals FA0_EN, FA1_EN, FA2_EN, and FA3_EN and the first to fourth fuse region selection signals SEL<3:0>. For example, when the first and second fuse region selection signals SEL<1:0> are activated to a logic high level, the calculation period selection block 253 may enable the calculation control signal EN to the logic high level during the first and second read periods. The calculation period may include the first and second read periods.

In accordance with embodiment of the present disclosure as described above, there is an advantage in that it is possible to easily calculate the number of used or unused fuse sets among a plurality of fuse sets included in at least one fuse region among a plurality of fuse regions.

As is apparent from embodiments of the present invention, advantages are provided in that the number of used or unused fuse sets may be easily calculated.

Also, as is apparent from embodiments of the present invention, advantages are provided in that the number of used or unused fuse sets may be easily calculated in a boot-up mode.

Although various embodiments have been described for illustrative purposes, it will be apparent to those skilled in the art that various changes and modifications may be made without departing from the spirit and scope of the invention as defined in the following claims.

What is claimed is:

1. A semiconductor device, comprising:
    a fuse selection circuit suitable for generating fuse set address signals based on a clock signal;
    a fuse array including a plurality of fuse sets and suitable for sequentially outputting fuse set data from the fuse sets based on the fuse set address signals;
    a read circuit suitable for sequentially generating read set data based on the clock signal and the fuse set data; and
    a calculation circuit suitable for calculating a number of used or unused fuse sets among the fuse sets based on the clock signal and a fuse information signal which includes at least one fuse read signal among a plurality of fuse read signals included in the read set data.

2. The semiconductor device of claim 1, wherein the calculation circuit includes:
    a delay block suitable for delaying the clock signal by a predetermined delay time to generate a delayed clock signal;
    a masking block suitable for selectively masking a toggling period of the clock signal based on the delayed clock signal and the fuse information signal; and
    a counting block suitable for counting a mask clock signal outputted from the masking block to generate count signals which correspond to the number of used or unused fuse sets.

3. The semiconductor device of claim 1, wherein the fuse read signal includes a first fuse read signal indicating whether fuse sets selected from the fuse sets are used or not, and
    the first fuse read signal includes a fuse read signal of a lowermost bit among the fuse read signals.

4. The semiconductor device of claim 1, wherein the calculation circuit includes:

a delay block suitable for delaying the clock signal by a predetermined delay time to generate a delayed clock signal;

a mask control block suitable for generating a mask information signal based on the fuse information signal;

a masking block suitable for selectively masking a toggling period of the clock signal based on the delayed clock signal and the mask information signal; and a counting block suitable for counting a mask clock signal outputted from the masking block to generate count signals which correspond to the number of used or unused fuse sets.

5. The semiconductor device of claim 1, wherein the fuse read signal includes a first fuse read signal indicating whether fuse sets selected from the fuse sets are used or not and a second fuse read signal indicating whether the selected fuse sets are defective or not, the first fuse read signal includes a fuse read signal of a lowermost bit among the fuse read signals, and the second fuse read signal includes at least one fuse read signal among fuse read signals other than the fuse read signal of the lowermost bit among the fuse read signals.

6. A semiconductor device, comprising:
a fuse selection circuit suitable for generating fuse set address signals based on a clock signal;

a fuse array including a plurality of fuse regions, each of which includes a plurality of fuse sets, and suitable for sequentially selecting a single fuse region among the fuse regions during a plurality of read periods and sequentially outputting fuse set data from the fuse sets for each read period, based on the fuse set address signals;

a read circuit suitable for sequentially generating read set data based on the clock signal and the fuse set data;

a control circuit suitable for generating a calculation control signal that is activated during a predetermined calculation period including at least one read period among the read periods, based on a plurality of fuse region selection signals and a read period identification signal; and a calculation circuit suitable for calculating a number of used or unused fuse sets among the fuse sets included in at least one fuse region among the fuse regions during the calculation period, and for calculating the number of used or unused fuse sets based on the calculation control signal, the clock signal, and a fuse information signal which includes at least one fuse read signal among a plurality of fuse read signals included in the read set data.

7. The semiconductor device of claim 6, wherein the calculation circuit includes:

a delay block suitable for delaying the clock signal by a predetermined delay time to generate a delayed clock signal;

a masking block suitable for selectively masking a toggling period of the clock signal based on the delayed clock signal and the fuse information signal; and a counting block suitable for counting a mask clock signal outputted from the masking block during the calculation period to generate count signals which correspond to the number of used or unused fuse sets.

8. The semiconductor device of claim 6, wherein the fuse read signal includes a first fuse read signal indicating whether fuse sets selected from the fuse sets are used or not, and the first fuse read signal includes a fuse read signal of a lowermost bit among the fuse read signals.

9. The semiconductor device of claim 6, wherein the calculation circuit includes:

a delay block suitable for delaying the clock signal by a predetermined delay time to generate a delayed clock signal;

a mask control block suitable for generating a mask information signal based on the fuse information signal;

a masking block suitable for selectively masking a toggling period of the clock signal based on the delayed clock signal and the mask information signal; and a counting block suitable for counting a mask clock signal outputted from the masking block during the calculation period to generate count signals which correspond to the number of used or unused fuse sets, wherein the calculation period is based on the calculation control signal.

10. The semiconductor device of claim 6, wherein the fuse read signal includes a first fuse read signal indicating whether fuse sets selected from the fuse sets are used or not and a second fuse read signal indicating whether the selected fuse sets are defective or not, the first fuse read signal includes a fuse read signal of a lowermost bit among the fuse read signals, and the second fuse read signal includes at least one fuse read signal among fuse read signals other than the fuse read signal of the lowermost bit among the fuse read signals.

11. The semiconductor device of claim 6, wherein each of the fuse region selection signals includes a test mode signal or a mode register set signal.

12. The semiconductor device of claim 6, wherein the fuse selection circuit includes:

an address counting block suitable for generating a plurality of divided clock signals that are divided at a predetermined division ratio based on the clock signal;

a row address decoding block suitable for generating a row address signal for sequentially selecting each of the fuse sets based on the divided clock signals; and a column address decoding block suitable for generating a column address signal for sequentially selecting each of the fuse sets based on the divided clock signals.

13. The semiconductor device of claim 12, wherein the read period identification signal includes a single divided clock signal among the divided clock signals.

14. A method for operating a semiconductor device, comprising:

entering a boot-up mode;

sequentially reading fuse set data from a plurality of fuse sets included in a fuse array whenever a clock signal toggles and sequentially generating read set data which corresponds to the fuse set data; and calculating a number of used or unused fuse sets among the fuse sets based on the clock signal and a fuse information signal which includes at least one fuse read signal among a plurality of fuse read signals included in the read set data.

15. The method of claim 14, wherein the calculating of the number of the used or unused fuse sets includes:

delaying the clock signal by a delay time to generate a delayed clock signal;

selectively masking a toggling period of the delayed clock signal based on the fuse information signal; and counting a mask clock signal generated from masking the toggling period of the delayed clock signal to generate count signals which correspond to the number of the used or unused fuse sets.

16. The method of claim 15, wherein the delay time is shorter than a single cycle of the clock signal.

17. A method for operating a semiconductor device, comprising:
 entering a boot-up mode;
 sequentially selecting a plurality of fuse regions included in a fuse array during a plurality of read periods based on a clock signal, sequentially reading fuse set data from a plurality of fuse sets included in each of the fuse regions whenever the clock signal toggles, and sequentially generating read set data which corresponds to the fuse set data; and
 calculating the number of used fuse sets or unused fuse sets among fuse sets included in at least one fuse region among the fuse regions during a predetermined calculation period which includes at least one read period among the read periods, based on the clock signal, a read period identification signal, and a fuse information signal which includes at least one fuse read signal among a plurality of fuse read signals included in the read set data.

18. The method of claim 17, wherein the calculating of the number of used or unused fuse sets includes:
 generating a calculation control signal based on the read period identification signal and a plurality of fuse region selection signals, wherein the calculation control signal is activated during the calculation period; and
 calculating the number used or unused fuse sets during the calculation period based on the calculation control signal, the clock signal, and the fuse information signal.

19. The method of claim 18, wherein the generating of the calculation control signal includes:
 detecting an edge of the read period identification signal and generating a plurality of edge detection signals corresponding to a detection result;
 generating a plurality of read period guide signals corresponding to the read periods based on the edge detection signals; and
 generating the calculation control signal based on the read period guide signals and the fuse region selection signals, wherein the calculation control signal is activated during the calculation period.

20. The method of claim 18, wherein each of the fuse region selection signals includes a test mode signal or a mode register set signal.

21. The method of claim 18, wherein the calculating of the number of the used or unused fuse sets includes:
 delaying the clock signal by a delay time to generate a delayed clock signal;
 selectively masking a toggling period of the delayed clock signal based on the fuse information signal; and
 counting a mask clock signal generated from masking the toggling period of the delayed clock signal to generate count signals which correspond to the number of the used or unused fuse sets, based on the calculation control signal.

22. The method of claim 21, wherein the delay time is shorter than a single cycle of the clock signal.

* * * * *